(12) United States Patent
Yoshida (10) Patent No.: US 7,514,766 B2
(45) Date of Patent: Apr. 7, 2009

(54) SEMICONDUCTOR DEVICE

(75) Inventor: Masatoshi Yoshida, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 106 days.

(21) Appl. No.: 11/541,590

(22) Filed: Oct. 3, 2006

(65) Prior Publication Data

US 2007/0080430 A1 Apr. 12, 2007

(30) Foreign Application Priority Data

Oct. 7, 2005 (JP) ............................. 2005-295285

(51) Int. Cl.
*H01L 39/00* (2006.01)
(52) U.S. Cl. .................................... 257/662
(58) Field of Classification Search ................ 257/299, 257/662, 296, 297, 349, 508, 547, 659, E29.28; 327/534, 536
See application file for complete search history.

(56) References Cited

U.S. PATENT DOCUMENTS

| | | | | |
|---|---|---|---|---|
| 4,430,581 A | * | 2/1984 | Mogi et al. .................. | 327/534 |
| 4,873,668 A | * | 10/1989 | Winnerl et al. .......... | 365/189.09 |
| 5,585,664 A | * | 12/1996 | Ito .............................. | 257/659 |
| 5,687,128 A | * | 11/1997 | Lee et al. .................... | 365/226 |
| 5,962,902 A | * | 10/1999 | Kato et al. ................... | 257/372 |
| 6,002,599 A | * | 12/1999 | Chow .......................... | 363/59 |
| 2003/0016565 A1 | * | 1/2003 | Jang et al. .............. | 365/189.09 |
| 2007/0040599 A1 | * | 2/2007 | Sato .......................... | 327/536 |
| 2007/0109034 A1 | * | 5/2007 | Itoh et al. ................... | 327/534 |

FOREIGN PATENT DOCUMENTS

| | | | |
|---|---|---|---|
| JP | 2912184 B2 | | 4/1999 |
| JP | 3184265 B2 | | 4/2001 |
| JP | 3293588 B2 | | 4/2002 |
| JP | 2004-207749 A | | 7/2004 |
| WO | WO 98-52112 | * | 4/1998 |
| WO | WO 2006-030375 | * | 9/2005 |

OTHER PUBLICATIONS

Hardee, K. et al, "A Fault-Tolerant 30 ns/375 mW 16K×1 NMOS Static Ram", IEEE Journal of Solid State Circuits, 1981, vol. 16, pp. 639-646.*

Takacs, D. et al, "Static and Transient Hardness in N-Well CMOS with On-Chip Substrate Bias Generator", Electron Devices Meeting-International, 1985, vol. 31, pp. 504-508.*

* cited by examiner

*Primary Examiner*—Steven Loke
*Assistant Examiner*—Suberr Chi
(74) *Attorney, Agent, or Firm*—Sughrue Mion, PLLC

(57) ABSTRACT

A semiconductor device in which the threshold voltage of transistors is controlled through the applied substrate bias and having relatively small size. The semiconductor device includes: a clock signal line; a shield wiring for shielding the clock signal line from another interconnection; and a substrate bias generating circuit. The substrate bias is applied through the shield wiring to a region on which a transistor is formed. The threshold voltage of the transistor depends to the substrate bias applied to the transistor.

5 Claims, 10 Drawing Sheets

RELATED ART

SEMICONDUCTOR DEVICE

BACKGROUND OF THE INVENTION

1. Field of the Invention

The present invention relates to a semiconductor device.

2. Description of the Related Art

In recent years, the advancement of the semiconductor manufacturing technique has promoted the miniaturization of semiconductor devices and the enhancement of the number of devices per unit area of a wafer. For example, in the case of manufacturing memory chips of the same storage capacity, the number of the chips that can be obtained from one silicon wafer can be increased, which can reduce the cost per chip. Also, in the case of manufacturing the memory chips of the same area, the storage capacity per chip can be increased, which enables a larger amount of information to be stored.

There is a case that because of the hyperfine structure, a current density when a transistor is operated and a static leakage current are increased, which results in the increase in the electric power consumption of the semiconductor device. Also, usually, in order to enhance the performance of the semiconductor device, the operational frequency is basically set higher, which consequently increases the electric power consumption.

A technique for suppressing the electric power consumption by decreasing the power voltage and a threshold voltage in response to the advancement of the hyperfine structure is known. However, when the threshold voltage of transistors is decreased correspondingly to the decrease in the power voltage, the off leakage current between the source and the drain of a transistor is increased.

In order to suppress the leakage current, a technique that applies a substrate bias (body bias) is known (for example, refer to Japanese Laid-Open Patent Application (JP-P2004-207749A) and Japanese Patent Publication JP-P3184265). The substrate bias is a weak bias voltage that is applied to the substrate terminal of a Metal Oxide Semiconductor transistor. In the following explanation, a bias in a direction which enhances the flow of the current flowing through the transistor is referred to as the forward substrate bias, and a bias in a direction which suppresses the flow of the current flowing through the transistor is referred to as the reverse substrate bias. In short, when the forward substrate bias is applied to a semiconductor device, the current flowing through the channel of a transistor is enhanced, and the transistor is operated at a higher speed or at a lower voltage. Also, during the period in which a semiconductor device is not operated (typically, when it is referred to as the standby mode or waiting mode), the leakage current can be reduced by applying the reverse substrate bias.

Typically, the semiconductor device includes at least one of a P-channel MOS transistor (hereafter, referred to as a PMOS transistor) and an N-channel MOS transistor (hereafter, referred to as an NMOS transistor). Usually, a PMOS transistor is configured inside an N-well formed on a P-type semiconductor substrate, and the substrate bias for the PMOS transistor (hereafter, referred to as an N-well side substrate bias Vnw) is applied on the N-well. Also, an NMOS transistor is configured inside a P-type semiconductor substrate or P-well, and a substrate bias for the NMOS transistor (hereafter, referred to as a P-well side substrate bias Vpw) is applied on the P-type semiconductor device or P-well.

When the forward substrate bias is applied, a higher potential is applied to the P-type semiconductor constituting the substrate terminal of a MOS transistor, and a lower potential is applied to the N-type semiconductor. In short, with the source potential of each of MOS transistors (which are the NMOS transistors or the PMOS transistors) as a reference potential, by representing the potential difference between the source potential and the substrate potential as the voltage Vbs, the forward substrate bias condition is represented, in the case of the NMOS transistor, by Vbs>0, and in the case of the PMOS transistor, by Vbs<0

In other words, by applying a voltage (hereafter, referred to as the first forward substrate bias Vnw1) which is the forward substrate bias and lower than the power voltage to the N-well constituting the substrate terminal of a PMOS transistor, the current flow in the transistor is enhanced. Also, by applying a voltage (hereafter, referred to as the second forward substrate bias Vpw2) which is the forward substrate bias and higher than the ground voltage to the P-type semiconductor substrate (or P-well) constituting the substrate terminal of an NMOS transistor, the current flow in the transistor is enhanced. Consequently, the operation speed of each of the transistors is enhanced.

On the contrary, when the reverse substrate bias is applied, a lower potential is applied to the P-type semiconductor constituting the substrate terminal of a MOS transistor, and a higher potential is applied to the N-type semiconductor. In short, with the source potential of each of MOS transistors (which are the NMOS transistors or the PMOS transistors) as a reference potential, by representing the potential difference between the source potential and the substrate potential as the voltage Vbs, the reverse substrate bias condition is represented, in the case of the NMOS transistor, by Vbs<0, and in the case of the PMOS transistor, by Vbs>0.

In other words, by applying a voltage (hereafter, referred to as the first reverse substrate bias Vnw2) which is the reverse substrate bias and higher than the power voltage to the N-well constituting the substrate terminal of a PMOS transistor, the leakage current is suppressed. Similarly, by applying a voltage (hereafter, referred to as the second reverse substrate bias Vpw2) which is the reverse substrate bias and lower than the ground voltage to the P-type semiconductor substrate (or P-well) constituting the substrate terminal of the NMOS transistor, the leakage current is suppressed.

On the other hand, in association with the advancement of the hyperfine structure and higher integration of the semiconductor device, the influences of crosstalk and skew caused by coupling capacitance between adjacent signal nets and the like has become unignorable. On this background, in order to reduce the influences of the crosstalk and the skew, a technique using shield wiring is known. In this technique, a signal net crossing to the other signal net and a signal net that is required to be prevented from the crossing from the other signal net exist. By locating a power supply net or ground net on both side of these kinds of signal nets, they are shielded (for example, refer to Japanese Patent Publication JP-P2912184 and Japanese Patent Publication JP-P3293588).

Also, in recent years, various techniques relating to the semiconductor manufacture have been provided, which results in the reduction of the cost for manufacturing semiconductor devices. For example, in a gate array and the like, basic logic circuits (gates) are prepared in advance in the alignment of an array (matrix arrangement) inside the chip, and only the wiring layer is designed and manufactured in accordance with the request of users. Thus, a semiconductor device can be manufactured at a low cost in a short period. Under such technical situations, the significance of the semiconductor device which is firstly designed by a designer and manufactured in accordance with the request of a user is enhanced. By manufacturing the semiconductor device in the method close to an order-made production as mentioned above, the request of a user can be sufficiently satisfied. In such a semiconductor device, the logic circuit which is arranged in array is not usually adopted, and there is a case that required function blocks are irregularly placed.

Figure 1:
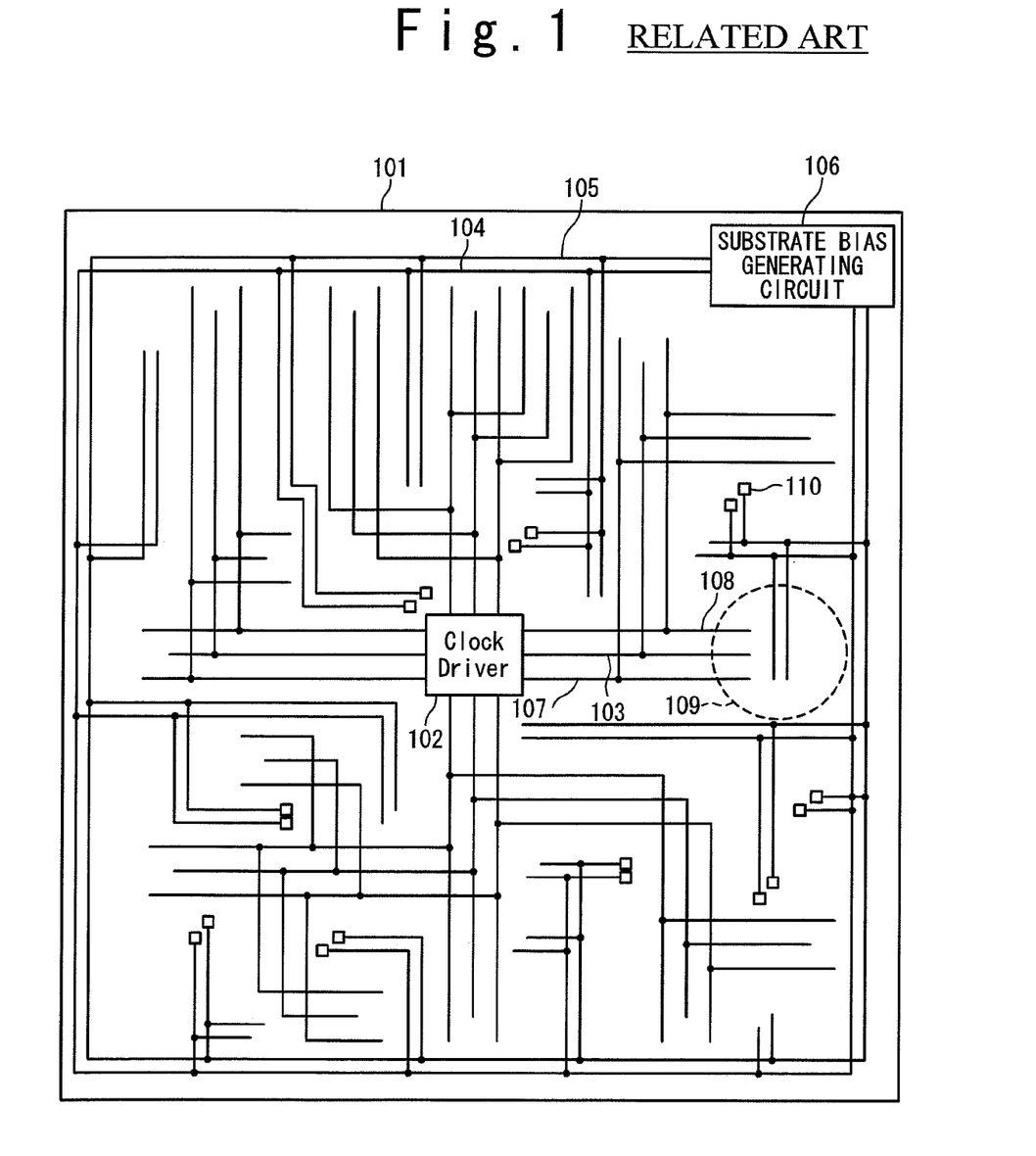
FIG. 1 is a plan view showing the configuration of a semiconductor device containing a conventional substrate bias node.

FIG. 1 is a plan view showing the configuration of a conventional semiconductor chip 101 which is manufactured in the method close to the order-made production and has a function for supplying the above mentioned substrate bias. With reference to FIG. 1, the conventional semiconductor chip 101 is provided with: a clock line 103 for distributing the clock signal generated by a clock driver 102; and shield wirings 107, 108 for reducing the influence of the clock sent through the clock line 103 on the other signal lines. The conventional semiconductor chip 101 is provided with: a Vnw bias node 104 for supplying the N-well side substrate bias Vnw; and a Vpw bias node 105 for supplying the P-well side substrate bias Vpw, and the respective bias nodes 104, 105 are constituted by metal interconnections. Also, as shown in FIG. 1, the Vnw bias node 104 and the Vpw bias node 105 are connected to a substrate bias generating circuit 106.

As mentioned above, in the case of manufacturing a semiconductor device in the method close to the order-made production, the logic circuits are not usually arranged in array, and there is the case that the required function blocks are irregularly arranged. Thus, in order to supply the substrate bias, the respective bias nodes 104, 105 are wired up to desirable regions through the empty regions of the chip, and the substrate bias is applied through a contact 110.

Figure 2:
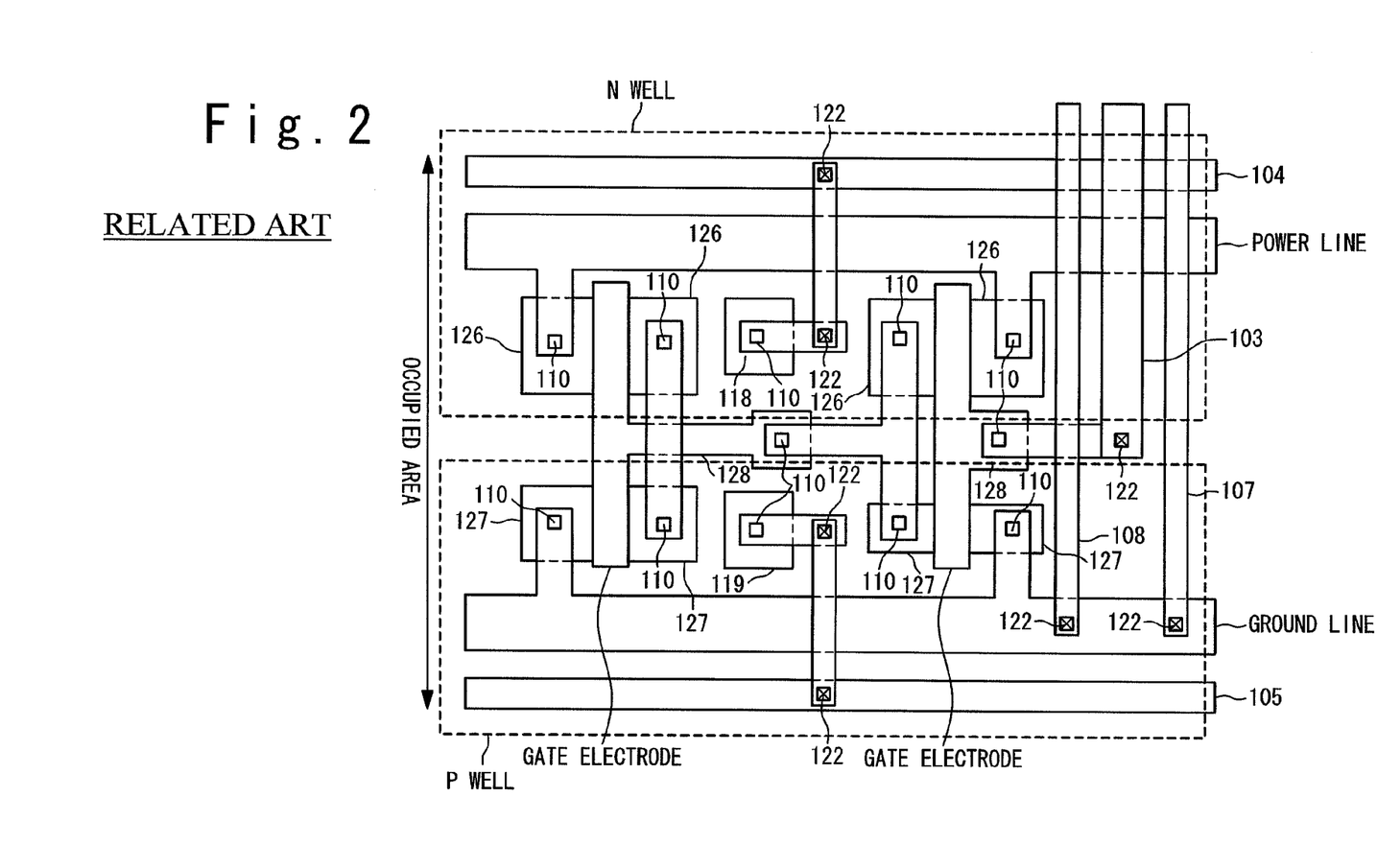
FIG. 2 is a plan view showing the layout of a conventional semiconductor device.

FIG. 2 is a plan view showing the configuration of the semiconductor circuit installed in a part (a region 109 shown in FIG. 1) of the conventional semiconductor chip 101. As shown in FIG. 2, the conventional semiconductor circuit has the N-well formed in the P-type semiconductor substrate and contains the P-diffusion region 126 in the N-well. Also, an N-diffusion region 127 is formed in the P-type semiconductor substrate. In the conventional semiconductor chip 101, the semiconductor circuit including Complementary MOS that is composed of the NMOS transistor inside the N-diffusion region 127 and the PMOS transistor inside the P-diffusion region 126 is formed. As shown in FIG. 2, the transistor having the CMOS has a gate electrode made of a polysilicon 128, and a signal supplied through the clock line 103 is applied to the gate electrode. With reference to FIG. 2, the conventional semiconductor chip 101 was required to reserve the region dedicated to the wiring for the bias nodes 104, 105. In short, in the conventional semiconductor device, the Vnw bias node 104 and the Vpw bias node 105 were constituted by the dedicated metal interconnections different from the chip wirings (for example, the clock line 103, shield wiring 107 and shield wiring 108).

With reference to FIG. 2, an N+ region 118 is formed in the N-well having the PMOS transistor. The N+ region 118 is connected through the contact 110 to the substrate bias supplying node 104. Namely, the substrate bias supplying node 104 applies the N-well side substrate bias Vnw, which is supplied from the substrate bias generating circuit 106, through the N+ region 118 to the N-well. Also similarly, the conventional semiconductor chip 101 is formed in the P-type semiconductor substrate and provided with a P+ region 119. As shown in FIG. 2, the P+ region 119 is connected through the contact 110 to the substrate bias supplying node 105. The substrate bias supplying node 105 is connected to the substrate bias generating circuit 106, similarly to the substrate bias supplying node 104, and applies the P-well side substrate bias Vpw, which is supplied from the substrate bias generating circuit 106, through the P+ region to the P-type semiconductor substrate.

SUMMARY OF THE INVENTION

As mentioned above, in the conventional technique, it is necessary to prepare the region which is dedicated to the wiring for the Vnw bias node 104 and the Vpw bias node 105 on the semiconductor substrate. In association with the advancement of the hyperfine structure of the semiconductor device (namely, further miniaturization of the structure of the semiconductor device), it is required to reduce the area on which the circuit is formed, while attaining the control of the threshold voltage through the substrate bias.

A subject to be solved in the present invention is to provide a semiconductor device of a smaller circuit area, while attaining a control of a threshold voltage through a substrate bias, in the semiconductor device in which the threshold voltage of the transistor is changed on the basis of the substrate bias.

For solving the problem, a semiconductor device according to the present invention includes: a clock signal line; a shield wiring shielding the clock signal line from an another interconnection; and a substrate bias generating section for generating a substrate bias and apply the substrate bias through the shield wiring to a predetermined region on a semiconductor substrate on which a transistor is formed. A threshold voltage of the transistor depends to the substrate bias applied to the transistor.

According to the present invention, it is possible to provide the semiconductor device of the smaller circuit area, while attaining the control of the threshold voltage of the substrate bias where the threshold voltage of the transistor is changed on the basis of the substrate bias.

Also, according to the conventional technique, in order to place metal interconnections in smaller region, it is required to make the wirings thinner or the interval between wirings narrower. As a result, the response delay tends to occur. According to the present invention, it is possible to provide the semiconductor device, which suppresses the response delay when the substrate bias is applied, while attaining the advancement of the hyperfine structure of the semiconductor device.

DESCRIPTION OF THE PREFERRED EMBODIMENT

First Embodiment

The embodiment of the semiconductor device of the present invention will be described below with reference to the drawings. In the following embodiments, it is supposed that the semiconductor device is the device which is constituted by one chip and has a normal mode in which normal operations are carried out and a standby mode in which operations except the minimum necessary operations are stopped for saving the electric power consumption.

Figure 3:
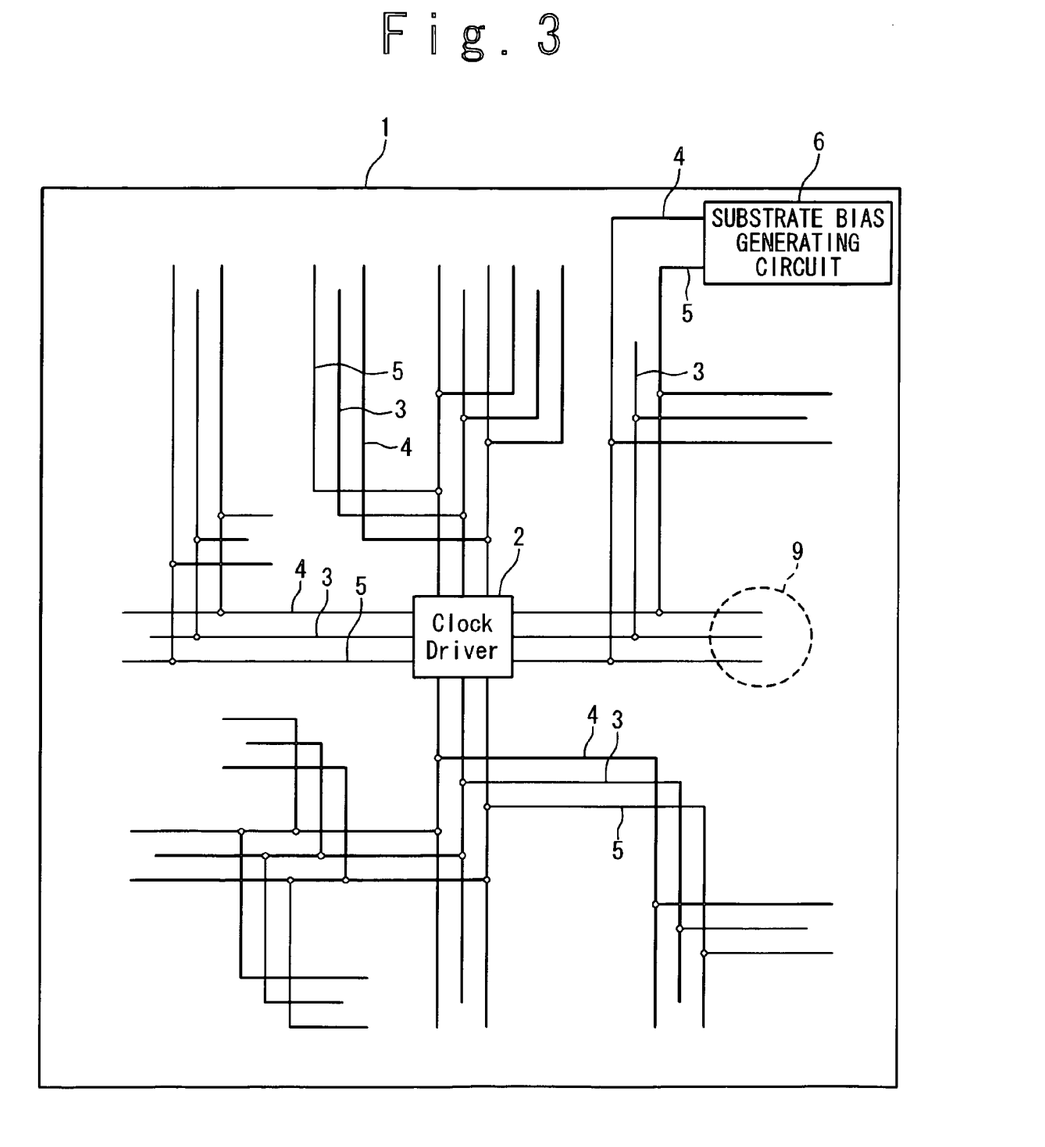
FIG. 3 is a plan view showing a schematic plan view of the semiconductor device containing a substrate bias node according to an embodiment of the present invention.

FIG. 3 shows a plan view of the semiconductor device 1 in this embodiment. With reference to FIG. 3, the semiconductor device 1 in the first embodiment contains a clock driver 2 and a clock line 3 for sending a clock signal outputted by the clock driver 2. Also, the semiconductor device 1 contains: an N-well side substrate bias supplying node 4 and a P-well side substrate bias supplying node 5 that are arranged along and in parallel with the clock line 3. As shown in FIG. 3, the N-well side substrate bias supplying node 4 and the P-well side substrate bias supplying node 5 are respectively connected to a substrate bias generating circuit 6.

The substrate bias generating circuit 6 is a circuit for generating the substrate bias, which is supplied to each of MOS transistors formed in the semiconductor substrate constituting the semiconductor device 1. In the following embodiments, it is assumed that the substrate bias generating circuit 6 includes a charge pump circuit. This assumption does not imply that the substrate bias generating circuit 6 constituting the semiconductor device 1 of the present invention is limited to the charge pump circuit. Also, in the following embodiments, it is assumed that the MOS transistors to which the substrate bias is supplied are contained inside the well formed in the substrate.

The substrate bias generating circuit 6 generates the forward substrate biases (Vnw1, Vpw1) in the normal mode and generates the reverse substrate biases (Vnw2, Vpw2) in the standby mode. In the standby mode, the respective substrate biases (Vnw, Vpw) are supplied through the N-well side substrate bias supplying node 4 and the P-well side substrate bias supplying node 5 to the MOS transistors inside the well. Also, in the normal mode, a power source potential VDD can be supplied through the N-well side substrate bias supplying node 4, and a ground potential GND can be supplied through the P-well side substrate bias supplying node 5.

Figure 4:
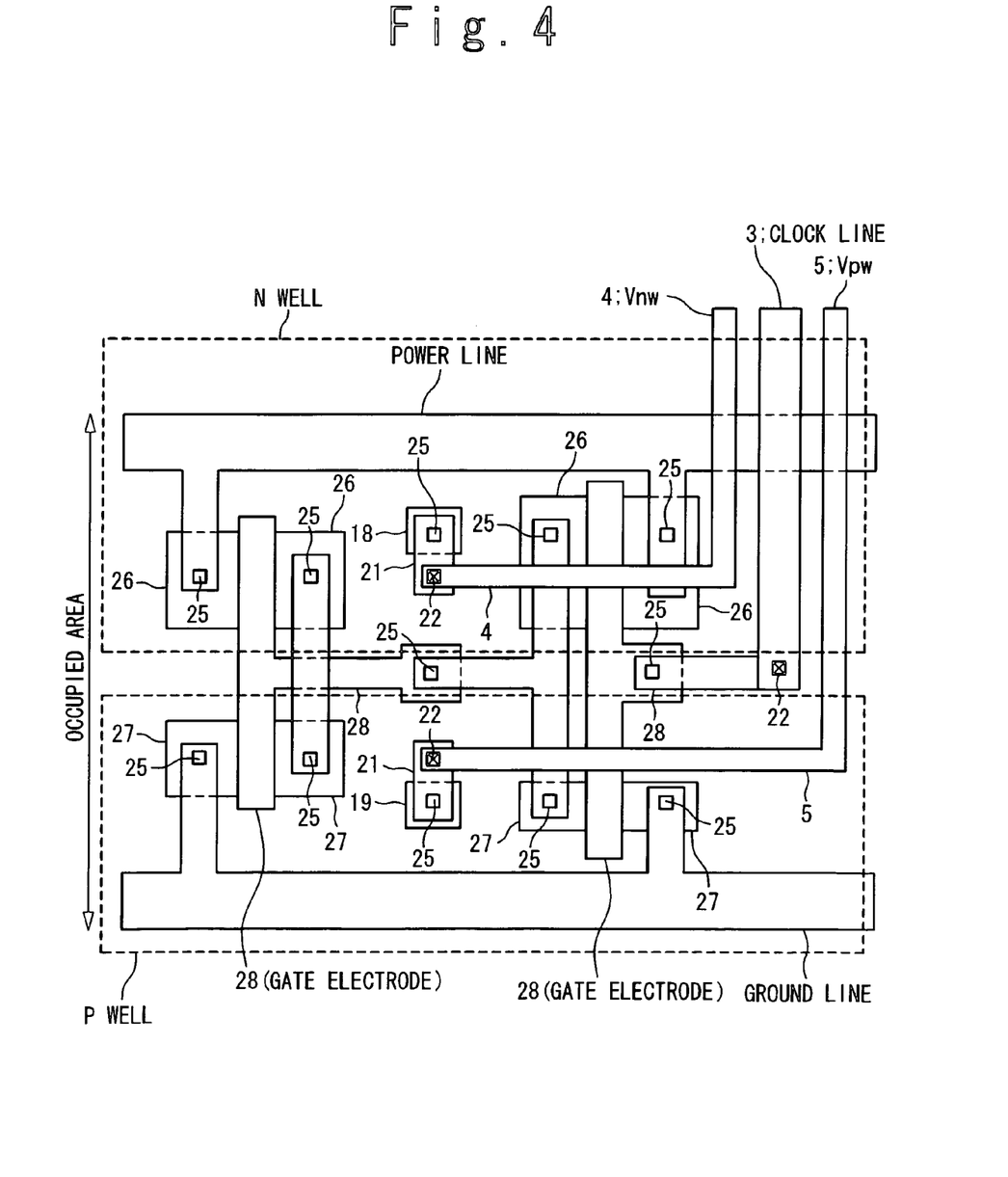
FIG. 4 is a plan view of a part of the layout of the semiconductor device of an embodiment of the present invention.

The configuration of each wiring in the semiconductor device 1 of this embodiment will be described below. FIG. 4 is a schematic plan view of the semiconductor circuit formed in a part (a region 9 in FIG. 3) of the semiconductor device 1 in the first embodiment. In the following embodiments, it is supposed that the semiconductor circuit contains CMOS which is composed of an NMOS transistor 15 inside a P-well formed in a P-type semiconductor substrate and a PMOS transistor 14 inside an N-well formed in the P-type semiconductor substrate. This supposition does not limit the configuration of the semiconductor circuit to which the present invention is applied.

With reference to FIG. 4, the semiconductor circuit formed in the semiconductor device 1 in the first embodiment contains the N-well side substrate bias supplying node 4 and the P-well side substrate bias supplying node 5, which are arranged so as to sandwich the clock line 3. An N-diffusion region 27 indicates an N-diffusion region formed in the N-well, and a P-diffusion region 26 indicates a P-diffusion region formed in the N-well. An N+ semiconductor region 18 is an N+ region formed in the N-well, and a P+ semiconductor region 19 is a P+ region. As shown in FIG. 4, the N-well side substrate bias supplying node 4 is connected through a metal interconnection 21 to the N+ semiconductor region 18. The N-well side substrate bias supplying node 4 and the metal interconnection 21 are connected through a via 22, and the metal interconnection 21 and the N+ semiconductor region 18 are connected through a contact 25. Similarly, the P-well side substrate bias supplying node 5 is connected through the metal interconnection 21 to the P+ semiconductor region 19. The P-well side substrate bias supplying node 5 and the metal interconnection 21 are connected through the via 22, and the metal interconnection 21 and the P+ semiconductor region 19 are connected through the contact 25. Also, as shown in FIG. 4, the transistor constituting the CMOS has the gate electrode made of a polysilicon 28, and the signal supplied through the clock line 3 is applied to the gate electrode.

For suppress the influence of the clock signal carried on the clock line 3 by using the N-well side substrate bias supplying node 4 and the P-well side substrate bias supplying node 5, the N-well side substrate bias supplying node 4 and the P-well side substrate bias supplying node 5 carry out the function of electrostatic shielding. For realizing the electrostatic shielding, it is not necessary that the potentials of the N-well side substrate bias supplying node 4 and the P-well side substrate bias supplying node 5 are always set to be at ground levels. In the semiconductor device 1 of this embodiment, the shield wirings are operated as the substrate bias supplying nodes. For this reason, the metal wiring dedicated to supply the substrate bias is not required to be placed. As a result, the increase of the chip area occupied by the circuit is suppressed.

Also, the conventional semiconductor device (for example, the chip 101 shown in FIG. 1) is provided with the substrate bias node other than the chip interconnections as mentioned above. For this reason, for designing the conventional semiconductor device, the designer specifies the empty region on which the chip interconnection is not laid, and then places the substrate bias node in the empty region. In the semiconductor device 1 in this embodiment, the working process for arranging the new substrate bias node at the design stage is not required, so that the time required to design the semiconductor is reduced.

Figure 5:
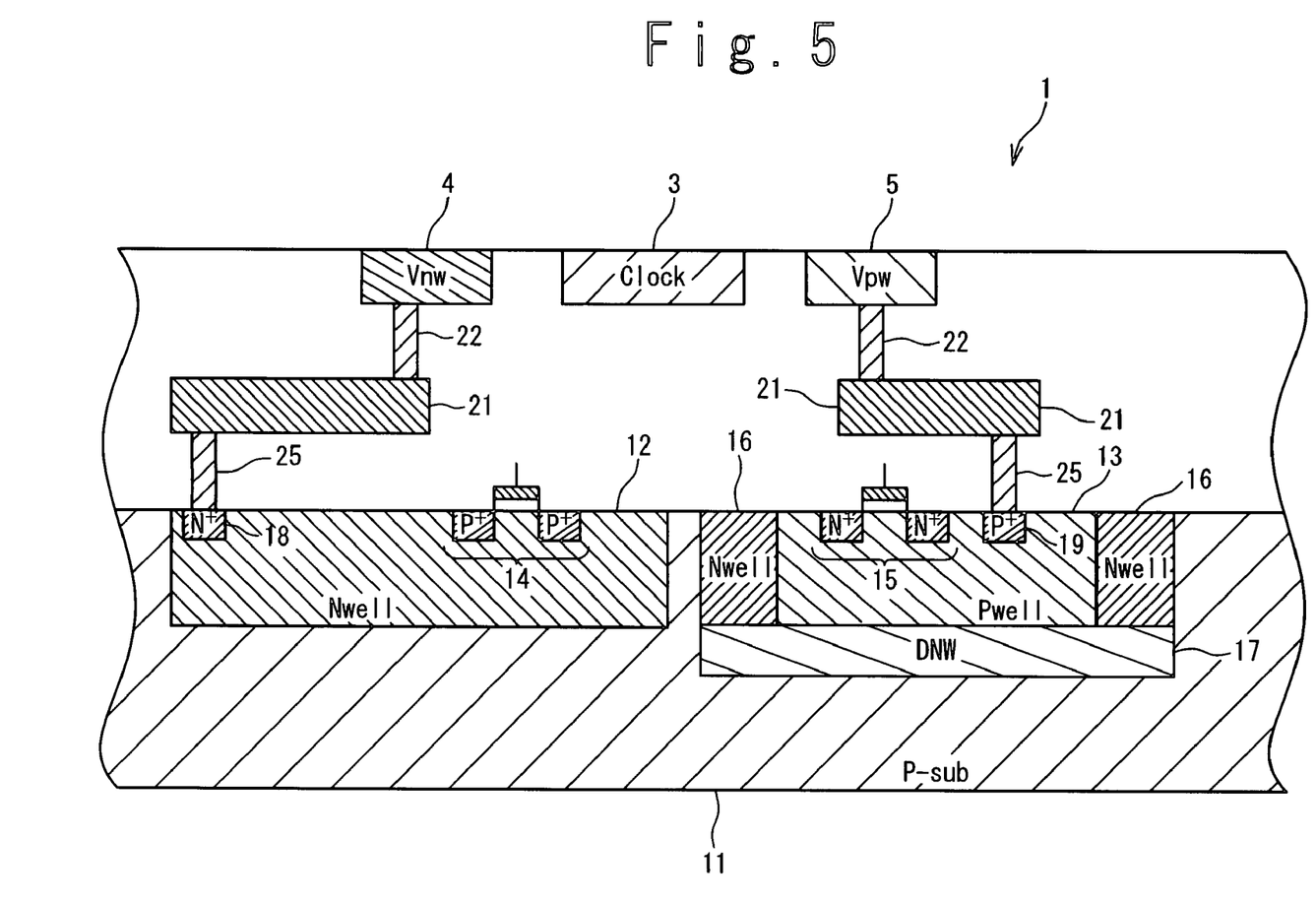
FIG. 5 is a sectional view of the semiconductor device containing the substrate bias node of an embodiment of the present invention.

Here, the configuration of the semiconductor device 1 in this embodiment is explained by using the sectional view. In the following embodiments, the sectional view of the semiconductor device in which an embodiment of the present invention is applied to a conventional semiconductor device is used for the purpose of the easy understanding of the present invention. FIG. 5 is the sectional view of the semiconductor device 1 in this embodiment. In this embodiment, it is assumed that the semiconductor device 1 has an N-well 12 and a P-well 13, which are formed in the P-type semiconductor substrate, and the MOS transistors are formed in respective wells. This assumption does not imply that the semiconductor device to which the present invention is applied is used only in the device having the three-layer configuration shown in FIG. 5.

Also as shown in FIG. 5, the P-well 13 and the semiconductor substrate 11 is electrically insulated from a semiconductor substrate 11, although the detail will be described later. Thus, in a case that a plurality of P-wells 13 are formed, since they are mutually electrically insulated, the substrate biases of different voltages can be supplied to the respective P-wells 13. Similarly, when a plurality of N-wells 12 are formed in the semiconductor substrate 11, the plurality of N-wells 12 are electrically insulated from each other. Thus, the substrate biases of the different voltages can be supplied to the respective N-wells 12.

With reference to FIG. 5, the semiconductor device 1 in the first embodiment is provided with: the semiconductor substrate 11; and a metal interconnection layer and a clock line layer, which are formed on the semiconductor substrate 11. As shown in FIG. 5, the semiconductor substrate 11 has the N-well 12 having the NMOS transistor 14. Also similarly, the semiconductor substrate 11 has the P-well 13 having the PMOS transistor 15. As shown in FIG. 5, the P-well 13 is installed in the region surrounded with an N-well 16 and a deep N-well 17. The N-well 12 contains the N+ semiconductor region 18 that receives the N-well side substrate bias Vnw. The P-well 13 contains the P+ semiconductor region 19 that receives the P-well side substrate bias Vpw.

With reference to FIG. 5, in the semiconductor device 1 in this embodiment, the N-well side substrate bias supplying node 4 and the P-well side substrate bias supplying node 5 are connected through the contacts 25 to the respective wells 12, 13. As shown in FIG. 5, the N-well side substrate bias supplying node 4 is connected through the via 22 to the metal interconnection 21 formed in the lower layer, and the metal interconnection 21 is connected through the contact 25 to the N+ semiconductor region 18 in the N-well 12. Similarly, the P-well side substrate bias supplying node 5 is connected through the via 22 to the metal interconnection 21. The metal interconnection 21 is connected through the contact 25 to the P+ semiconductor region 19 in the P-well 13.

As mentioned above, the substrate bias generating circuit 6 installed in the semiconductor device 1 in this embodiment is connected to the N-well side substrate bias supplying node 4 and the P-well side substrate bias supplying node 5. The substrate bias generating circuit 6 selectively generates the N-well side substrate bias Vnw or the P-well side substrate bias Vpw in response to a control signal indicating whether the operation state of the semiconductor device 1 is at the normal mode or standby mode. The N-well side substrate bias Vnw outputted by the substrate bias generating circuit 6 is supplied through the N-well side substrate bias supplying node 4 to the N-well 12 formed in the semiconductor substrate 11. Similarly, the P-well side substrate bias Vpw outputted by the substrate bias generating circuit 6 is supplied through the P-well side substrate bias supplying node 5 to the P-well 13.

The relation between the substrate bias applied to the MOS transistor and the performance of the MOS transistor will be described below. As mentioned above, when the forward substrate bias is applied to the semiconductor device, the current is flow through the channel portion of the transistor is promoted, and the transistor is operated at the higher speed or at the lower voltage. Also, when the semiconductor device is at rest (namely, at the standby mode), the leakage current can be reduced by applying the reverse substrate bias.

Figure 6A:
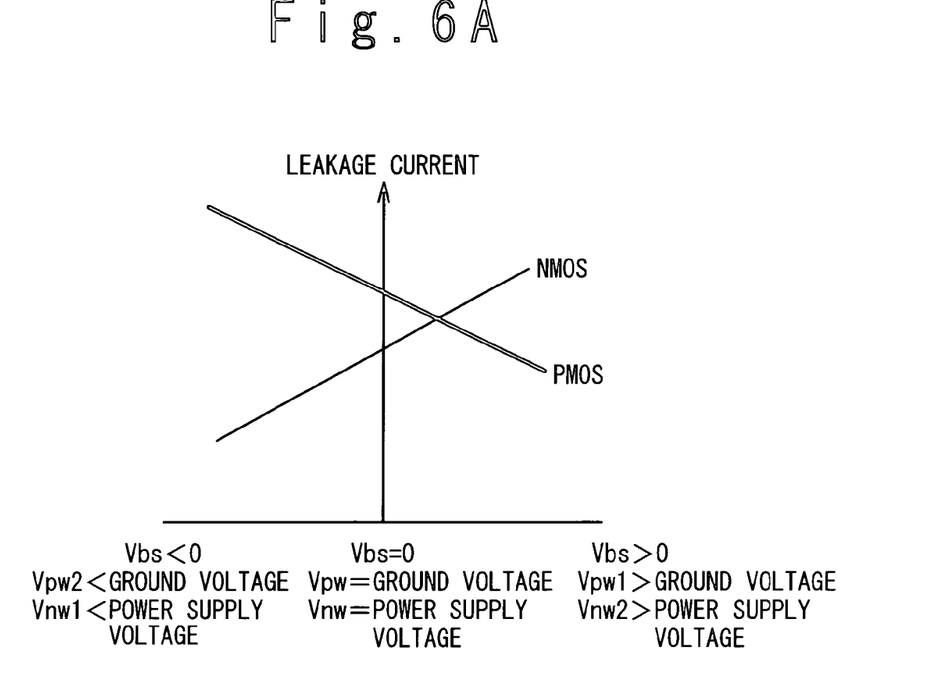
FIG. 6A is a graph showing the relation between the substrate bias and the leakage current.
Figure 6B:
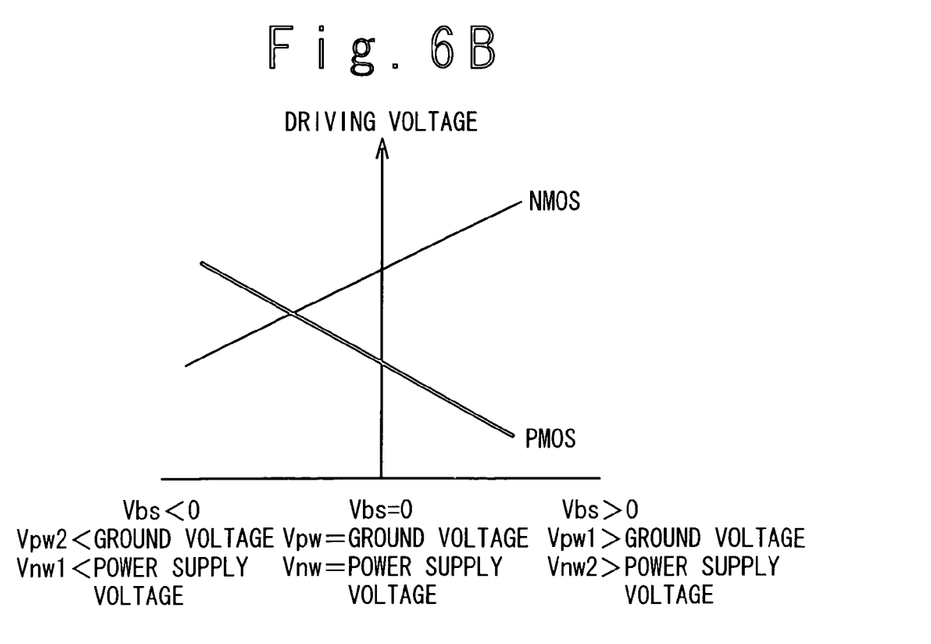
FIG. 6B is a graph showing the relation between the substrate bias and the performance.

FIGS. 6A, 6B are graphs showing the relation between the substrate bias and the performance of the MOS transistor. FIGS. 6A, 6B show the change in the performance of the MOS transistor when the foregoing voltage Vbs is changed. FIG. 6A is the graph showing the relation between the applied substrate bias and the leakage current. FIG. 6B is the graph showing the relation between the applied substrate bias and a driving current of the MOS transistor. The horizontal axes of FIGS. 6A, 6B indicate the voltage Vbs, and the center indicates 0, the right side indicates the positive value, and the left side indicates the negative value. In other words, the right side of the horizontal axis indicates the case that the first reverse substrate bias Vnw2 is set higher than the power source voltage (or the case that the second reverse substrate bias Vpw2 is set lower than the ground voltage).

As mentioned above, for applying the reverse substrate bias, the substrate bias is applied which makes the potential P-type semiconductor constituting the substrate terminal of the MOS transistor low and makes the potential of the N-type semiconductor high. In short, when the source potential is defined as the reference potential and when the potential difference between the source potential and the substrate potential of each of the MOS transistors (the NMOS transistor and the PMOS transistor) is defined as the voltage Vbs, the reverse substrate bias is applied to the semiconductor device when the condition Vbs<0 is satisfied for the NMOS transistor, and when the condition Vbs>0 is satisfied for the PMOS transistor.

With reference to FIG. 6A, when the first reverse substrate bias Vnw2 is gradually made higher than the power source voltage (or when the second reverse substrate bias Vpw2 is gradually made lower than the ground voltage), the leakage current is decreased, but the performance of the MOS transistor is reduced as shown in FIG. 6B. When the semiconductor device 1 is at the standby mode, the enhancement of the performance is not required so much. Thus, by changing the substrate bias correspondingly to the operation mode of the semiconductor device 1, it is possible to set the optimal balance between the performance and the electric power consumption.

In other words, by changing the substrate bias in accordance with the required performance, it is possible to minimize the electric power consumption. When the high performance is required, the substrate bias (the reverse substrate bias) is not applied, which improves the drive performance of the MOS transistor. On the contrary, when the high performance is not required, the reverse substrate bias is applied. By applying the reverse substrate bias, the leakage current can be reduced, thereby decreasing the electric power consumption. Moreover, by executing the control of the substrate bias gradually, it is possible to finely control the performance and the electric power consumption.

In the semiconductor device 1 in this embodiment, the performance and electric power consumption of the MOS transistor are controlled (namely, the relation between the leakage current and the driving current is optimized), by applying the N-well side substrate bias Vnw and the P-well side substrate bias Vpw through the N-well side substrate bias supplying node 4 and the P-well side substrate bias supplying node 5, which act as the shield wirings as mentioned above. Thus, the semiconductor device 1 in this embodiment can provide the semiconductor device which is operated at the optimized performance while suppressing the increase in the chip area. Also, even when the forward substrate biases (Vnw1, Vpw1) are applied for improving the performance of the semiconductor device, the configuration of the present invention can be naturally applied.

Second Embodiment

The second embodiment of the present invention will be described below with reference to the drawings. In the following explanation, the members to which the same symbols as the symbols used in the explanation of the first embodiment are assigned have the similar configurations and operations. Thus, they are not explained in detail.

Figure 7:
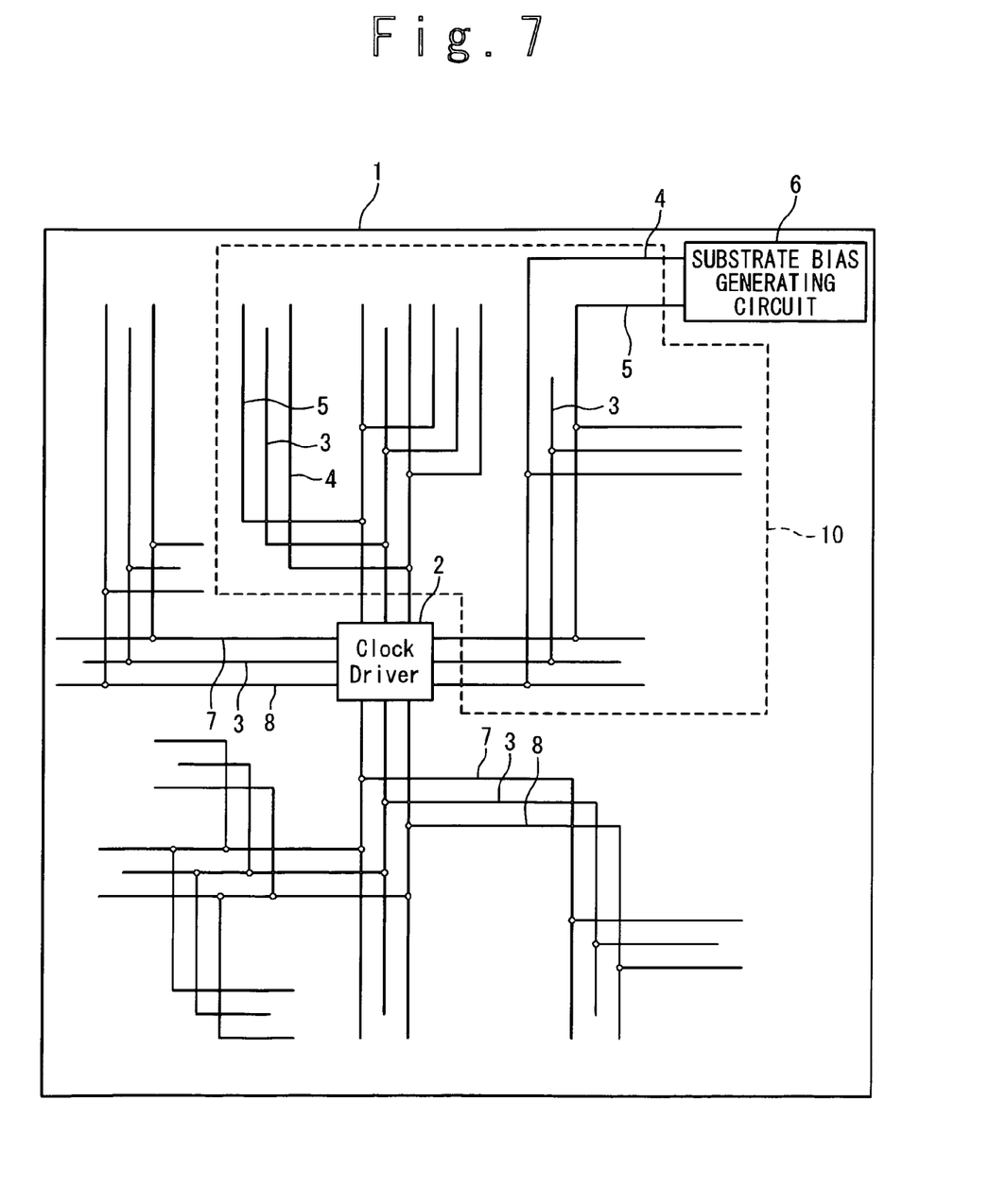
FIG. 7 is a plan view of a semiconductor device in a second embodiment of the present invention.

FIG. 7 is a plan view of the semiconductor device 1 according to the second embodiment of the present invention. With reference to FIG. 7, the substrate bias generating circuit 6 installed in the semiconductor device 1 of the second embodiment supplies the substrate bias to a particular region (for example, a substrate bias application region 10 shown in FIG. 7). There are semiconductor devices having a mixture of the region in which the threshold voltage is controlled through the substrate bias and the region in which such control is not required. In the second embodiment, when the semiconductor device 1 is the semiconductor device having such a mixture configuration, the N-well side substrate bias supplying node 4 and the P-well side substrate bias supplying node 5 are installed in the substrate bias application region 10 that requires the application of the substrate bias, and the voltage of the ground level is supplied through the shield wirings (7, 8) to the other regions.

The semiconductor device 1 in the second embodiment is preferably configured as shown in FIG. 5. Since the P-wells 13 are electrically insulated from the semiconductor substrate 11, the substrate biases of the different voltages can be supplied to the respective P-wells 13. Similarly, when the plurality of N-wells 12 are formed in the semiconductor substrate 11, the plurality of N-wells 12 are electrically insulated from each other. Thus, the substrate biases of the different voltages can be supplied to the respective N-wells 12. The semiconductor device 1 in the second embodiment is configured such that the shield wiring 7 and the shield wiring 8 are not connected to the N+ semiconductor region 18 and the P+ semiconductor region 19. Consequently, the electric power consumption can be decreased, as compared with the case that the substrate bias is supplied to the whole semiconductor device 1.

Third Embodiment

The third embodiment of the present invention will be described below with reference to the drawings. In the explanation of this embodiment, the members to which the same symbols as the symbols used in the explanations of the other embodiments are assigned have the similar configurations and operations. Thus, they are not explained in detail.

Figure 8:
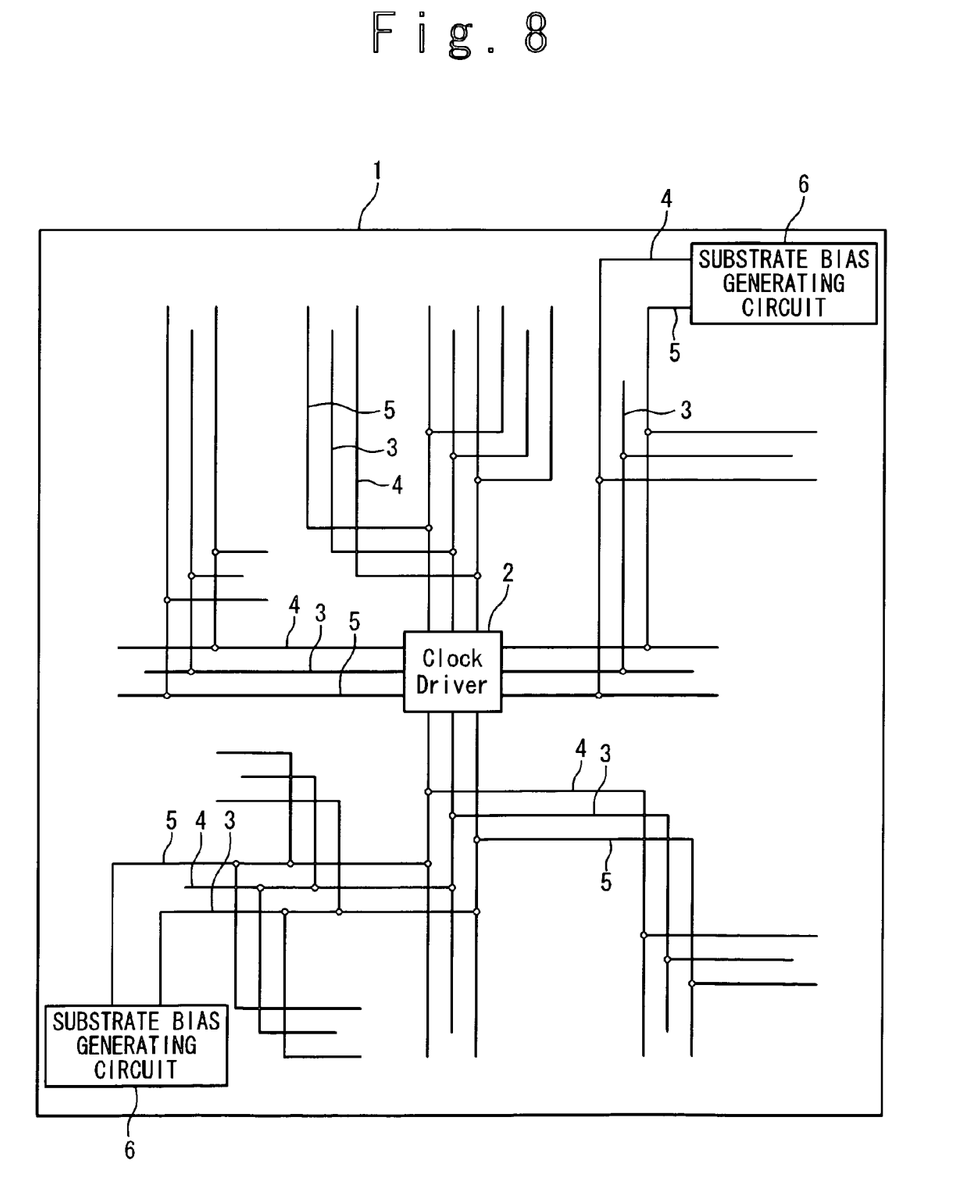
FIG. 8 is a plan view of a semiconductor device in a third embodiment of the present invention.

FIG. 8 is a plan view of the semiconductor device 1 according to the third embodiment of the present invention. With reference to FIG. 8, the semiconductor device 1 in the third embodiment is provided with a plurality of substrate bias generating circuits 6. Although only two substrate bias generating circuits 6 are drawn in FIG. 8, the number of the substrate bias generating circuits can be set more than three. Under the condition that the signal delay is induced correspondingly to the advancement of the hyperfine structure of the semiconductor device, there is a case that the difference in the response speed is generated between the transistor formed near the substrate bias generating circuit 6 and the transistor formed at the position whose distance from the substrate bias generating circuit 6 is large. Since the semiconductor device 1 described in the third embodiment contains the plurality of substrate bias generating circuits 6 placed at the different areas, the induced delay can be reduced.

Fourth Embodiment

The fourth embodiment of the present invention will be described below with reference to the drawings. In the explanation of this embodiment, the members to which the same symbols as the symbols used in the explanations of the other embodiments are assigned have the similar configurations and operations. They are not explained in detail.

Figure 9:
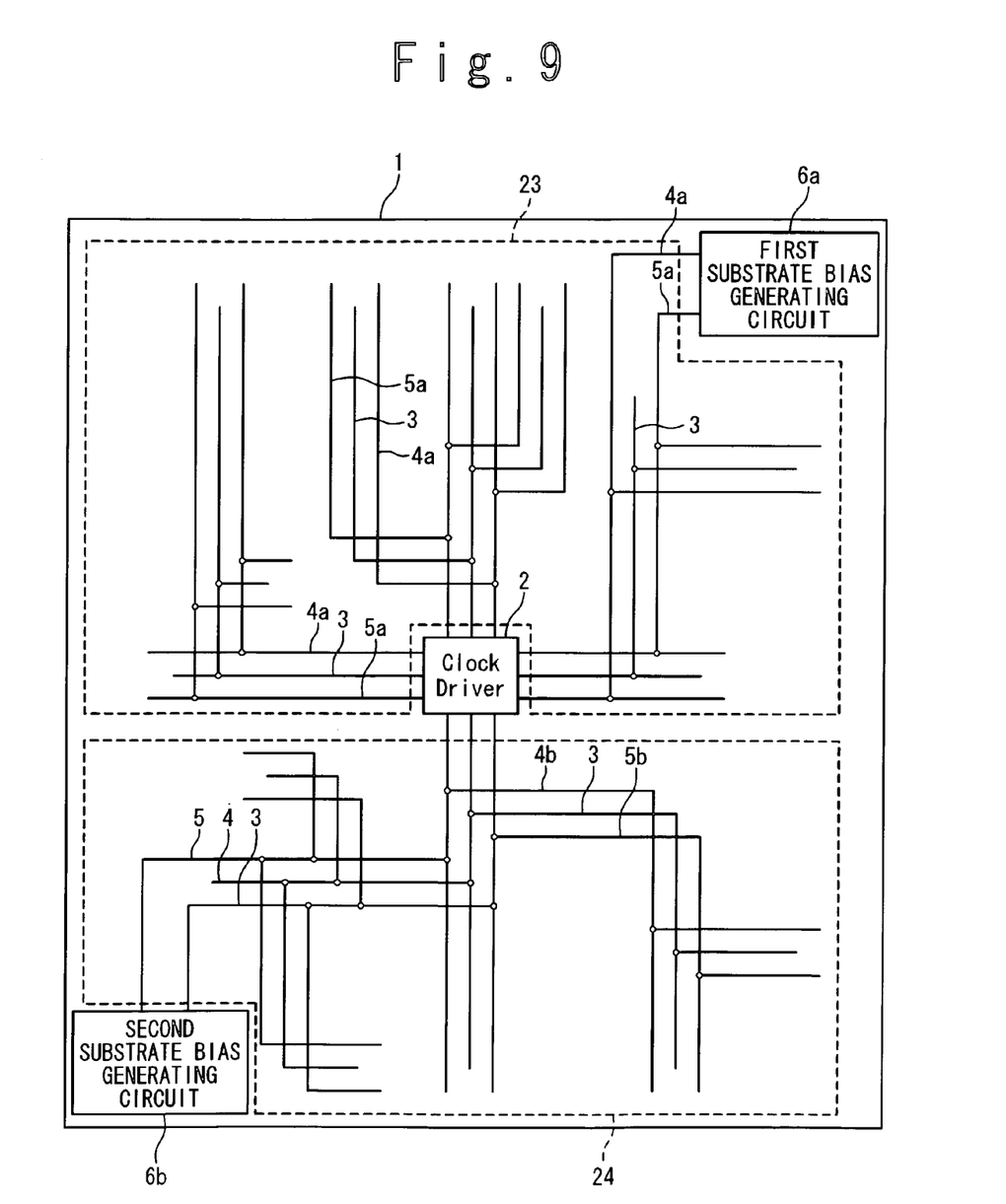
FIG. 9 is a plan view of a semiconductor device in a fourth embodiment of the present invention.

FIG. 9 is a plan view of the semiconductor device 1 according to the fourth embodiment of the present invention. With reference to FIG. 9, the semiconductor device 1 in the fourth embodiment is provided with a plurality of substrate bias generating circuits (6a, 6b). With reference to FIG. 9, in the semiconductor device 1 of the fourth embodiment, a first substrate bias is supplied to a first region (for example, a first region 23 shown in FIG. 9), and a second substrate bias is supplied to a second region (for example, a second region 24 shown in FIG. 9).

The semiconductor device 1 in the fourth embodiment is preferably configured as shown in FIG. 5, similarly to the second embodiment. Namely, when the plurality of P-wells are provided with the semiconductor substrate 11, since the P-wells 13 are electrically insulated from the semiconductor substrate 11, the substrate biases of the different voltages can be supplied to the respective P-wells 13. Also, when the plurality of N-wells 12 are provided with the semiconductor substrate 11, the plurality of N-wells 12 are electrically insulated from each other. Thus, the substrate biases of the different voltages can be supplied to the respective N-wells 12.

There are semiconductor devices in which the threshold voltages are controlled by using the plurality of different substrate biases in one chip. In order to make a design corresponding to such a semiconductor device 1, the first substrate bias generating circuit 6a in the fourth embodiment generates the first substrate bias and applies the first substrate bias through a first N-well side substrate bias supplying node 4a and a first P-well side substrate bias supplying node 5a to the MOS transistor formed in the region corresponding to the first region 23. Similarly, the second substrate bias generating circuit 6b generates the second substrate bias different from the first substrate bias. Then, the second substrate bias is applied through a second N-well side substrate bias supplying node 4b and a second P-well side substrate bias supplying node 5b to the MOS transistor formed in the region corresponding to the second region 24.

As mentioned above, the semiconductor device to which the present invention is applied is provided with: the N-well having the PMOS transistor 14; and the P-well having the NMOS transistor 15. When the plurality of N-wells are formed, they are electrically insulated through the P-type semiconductor substrate 11 from each other. Also, when the plurality of P-wells are formed, they are electrically insulated through the N-well 16 and the deep N-well 17 from each other. Thus, since the first substrate bias generating circuit 6a and the second substrate bias generating circuit 6b are installed and the first substrate bias generating circuit 6a and the second substrate bias generating circuit 6b supply the substrate biases of the different voltages, the first region 23 and the second region 24 can be controlled independently of each other. In FIG. 9, the semiconductor devices 1 correspond to only two kinds of the substrate biases. However, it is obvious that the number of the differently set substrate biases is arbitral and can be more than three.

Fifth Embodiment

The fifth embodiment of the present invention will be described below with reference to the drawings. In the explanation of this embodiment, the members to which the same symbols as the symbols used in the explanations of the other embodiments are assigned have the similar configurations and operations. Thus, they are not explained in detail.

Figure 10:
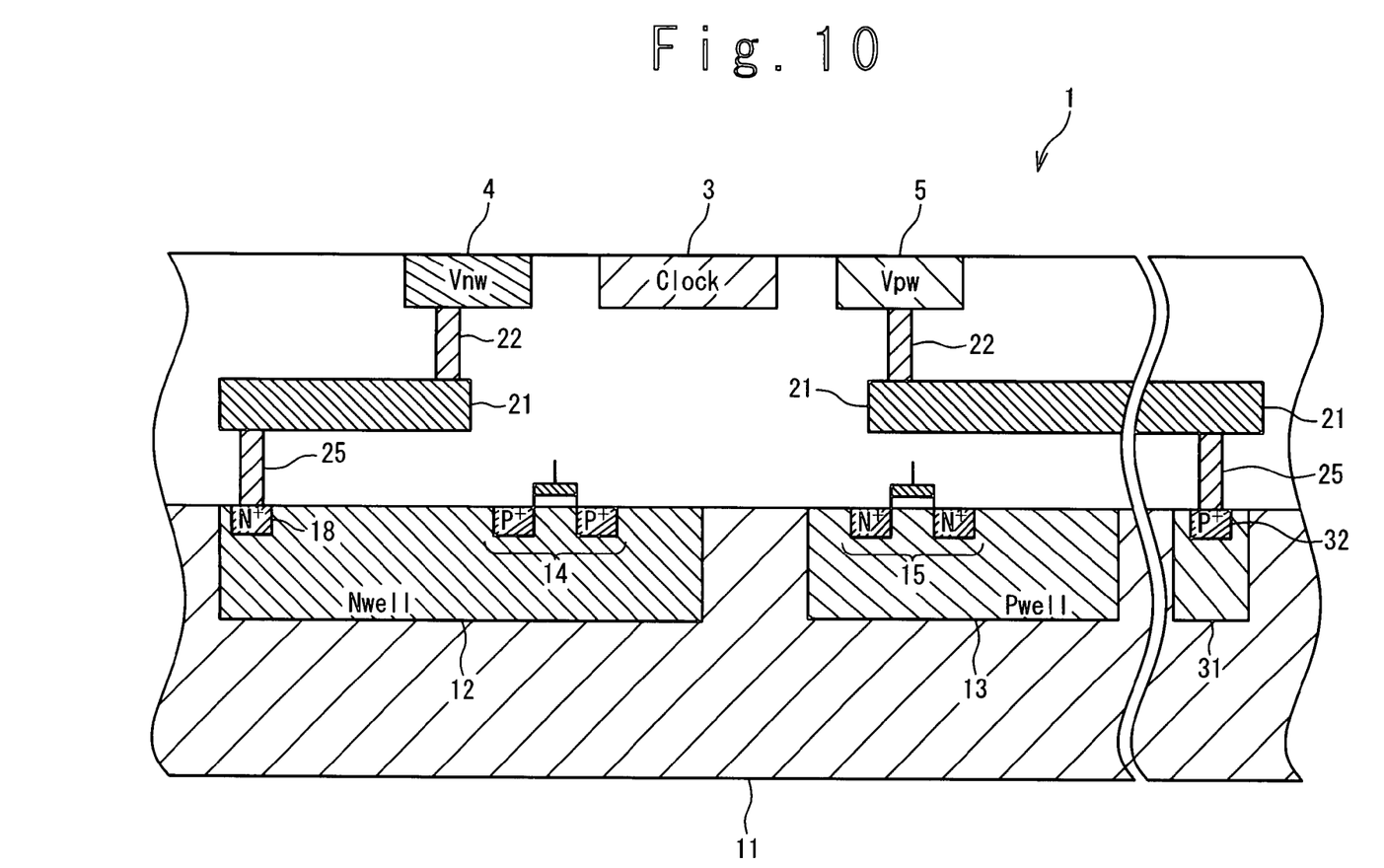
FIG. 10 is a plan view of a semiconductor device in a fifth embodiment of the present invention.

FIG. 10 is a sectional view of the fifth embodiment of the present invention. With reference to FIG. 10, the semiconductor device 1 in the fifth embodiment is provided with a sub-well 31 formed in the semiconductor substrate 11. Also, as shown in FIG. 10, the sub-well 31 includes a P+ semiconductor region 32, and its P+ semiconductor region 32 is connected through the contact 25 to the P-well side substrate bias supplying node 5.

The semiconductor device 1 in the fifth embodiment contains the substrate bias generating circuit 6, similarly to the semiconductor device 1 of the first embodiment. The substrate bias generating circuit 6 of the fifth embodiment is connected to the N-well side substrate bias supplying node 4 and the P-well side substrate bias supplying node 5 and generates the N-well side substrate bias Vnw and the P-well side substrate bias Vpw, in response to the control signal indicating whether the operation state of the semiconductor device 1 is at the normal mode or standby mode. The N-well side substrate bias Vnw outputted by the substrate bias generating circuit 6 is applied through the N-well side substrate bias supplying node 4 to the N+ semiconductor region 18 and supplied through the N+ semiconductor region 18 to the N-well 12. When the plurality of N-wells 12 are formed in the semiconductor substrate 11, the plurality of N-wells 12 are electrically insulated from each other. Thus, the substrate biases of the different voltages can be supplied to the respective N-wells 12.

In the fifth embodiment, the P-well side substrate bias Vpw outputted by the substrate bias generating circuit 6 is applied through the P-well side substrate bias supplying node 5 to the P+ semiconductor region 32 of the sub-well 31. The P-well side substrate bias Vpw applied to the P+ semiconductor region 32 is supplied through the semiconductor substrate 11 to the P-well 13. Thus, when the plurality of P-wells 13 are formed in the semiconductor substrate 11, the substrate potentials of the plurality of P-wells 13 can be all equalized through the semiconductor substrate 11. Also, hence, the semiconductor device 1 in the fifth embodiment can achieve the effect similar to that of the semiconductor device 1 in the first embodiment.

In the above-mentioned embodiments, one route of the N-well side substrate bias supplying node 4 or the P-well side substrate bias supplying node 5 is connected to one substrate bias generating circuit 6. For applying the present invention, the effects described in the above-mentioned embodiments can be achieved even in the configuration where the plurality of substrate bias generating circuits 6 are installed in one routes of the N-well side substrate bias supplying node 4 or the P-well side substrate bias supplying node 5. Also, in the above-mentioned embodiments, the semiconductor devices where the respective circuits are formed in the P-type semiconductor substrate are exemplified. However, the application of the present invention is not limited to such kind of the semiconductor devices. For example, even in the case that the present invention is applied to the semiconductor device where the respective circuits are formed in the N-type semiconductor substrate, the effects similar to those of the above-mentioned embodiments can be achieved.

Also, in the above-mentioned embodiments, the N-well side substrate bias supplying node 4 and the P-well side substrate bias supplying node 5 are arranged along the clock lines 3. Since the respective substrate bias supplying nodes (4, 5) have such configuration, the effect of shielding the clock line 3 and the function for supplying the substrate bias can be attained substantially at the same time. Here, the substrate bias generating circuit 6 may be configured to supply the substrate bias to only one of the N-well side substrate bias supplying node 4 and the P-well side substrate bias supplying node 5.

Moreover, any arbitral combinations of the above-mentioned embodiments can be executed, if any interference is not induced by the combination.

What is claimed is:

1. A semiconductor device comprising:
   a semiconductor substrate;
   a transistor;
   a clock signal line;
   a shield wiring, which shields said clock signal line from at least one interconnection; and
   a substrate bias generating section, electrically connected to said shield wiring, and configured to generate a substrate bias and apply said substrate bias through said shield wiring to a predetermined region on said substrate on which said transistor is formed,
   wherein a threshold voltage of said transistor depends on said substrate bias applied to said transistor.

2. The semiconductor device according to claim 1, further comprising:
   a second clock signal line; and
   a second shield wiring, set to a fixed potential which shields said second clock signal line from at least one interconnection.

3. The semiconductor device according to claim 1, further comprising:
   a second clock signal line;
   a second shield wiring which shields said second clock signal line from at least one interconnection; and
   a second substrate bias generating section, electrically connected to said second shield wiring, and configured to generate said substrate bias and apply said substrate bias through said second shield wiring to a second predetermined region on said substrate.

4. The semiconductor device according to claim 1, further comprising:
   a second clock signal line;
   a second shield wiring which shields said second clock signal line from at least one interconnection; and
   a second substrate bias generating section, electrically connected to said second shield wiring, and configured to generate a second substrate bias and apply said second substrate bias through said second shield wiring to a second predetermined region on said substrate,
   wherein a threshold voltage of a second transistor formed on said second predetermined region depends to said second substrate bias applied to said second transistor.

5. The semiconductor device according to claim 1, wherein said shield wiring comprises:
   a first shielding interconnection disposed adjacent to a first side of said clock signal line; and
   a second shielding interconnection disposed adjacent to a second side of said clock signal line, opposite said first side,
   wherein said substrate bias generating section applies said substrate bias to at least one of said first shielding interconnection and said second shielding interconnection.

* * * * *